United States Patent
Schweinfurth et al.

(10) Patent No.: US 11,505,865 B2
(45) Date of Patent: Nov. 22, 2022

(54) PROCESS FOR THE GENERATION OF METAL- OR SEMIMETAL-CONTAINING FILMS

(71) Applicant: BASF SE, Ludwigshafen am Rhein (DE)

(72) Inventors: David Dominique Schweinfurth, Ludwigshafen (DE); Lukas Mayr, Ludwigshafen (DE); Sinja Verena Klenk, Ludwigshafen (DE); David Scheschkewitz, Saarbrücken (DE); Kinga Izabela Leszczynska, Saarbrücken (DE)

(73) Assignee: BASF SE, Ludwigshafen am Rhein (DE)

( * ) Notice: Subject to any disclaimer, the term of this patent is extended or adjusted under 35 U.S.C. 154(b) by 0 days.

(21) Appl. No.: 17/259,666

(22) PCT Filed: Jul. 4, 2019

(86) PCT No.: PCT/EP2019/067973
§ 371 (c)(1),
(2) Date: Jan. 12, 2021

(87) PCT Pub. No.: WO2020/011637
PCT Pub. Date: Jan. 16, 2020

(65) Prior Publication Data
US 2021/0324516 A1 Oct. 21, 2021

(30) Foreign Application Priority Data
Jul. 12, 2018 (EP) ..................... 18183135

(51) Int. Cl.
*C23C 16/18* (2006.01)
*C23C 16/32* (2006.01)
(Continued)

(52) U.S. Cl.
CPC ........ *C23C 16/45553* (2013.01); *C23C 16/18* (2013.01); *C23C 16/32* (2013.01);
(Continued)

(58) Field of Classification Search
CPC ... C23C 16/45553; C23C 16/08; C23C 16/18; C23C 16/32; C23C 16/34; C23C 16/36; C23C 16/45534
See application file for complete search history.

(56) References Cited

U.S. PATENT DOCUMENTS 8,796,483 B2 * 8/2014 Gordon ............. C23C 16/45553 556/81
2008/0108175 A1 5/2008 Shin et al.
(Continued)

FOREIGN PATENT DOCUMENTS

WO 2008/057616 A2 5/2008
WO 2017/093265 A1 6/2017

OTHER PUBLICATIONS

Hopkinson et al; An overview of N-heterocyclic carbenes; vol. 510; Nature; Jun. 26, 2014; pp. 485-496 (Year: 2014).*
Asay, et al., "N-Heterocyclic Carbene Analogues with Low-Valent Group 13 and Group 14 Elements: Syntheses, Structures, and Reactivities of a New Generation of Multitalented Ligands", Chemical Reviews, vol. 111, Issue 2, 2011, pp. 354-396.
(Continued)

*Primary Examiner* — Elizabeth A Burkhart
(74) *Attorney, Agent, or Firm* — Faegre Drinker Biddle & Reath LLP

(57) ABSTRACT

The present invention is in the field of processes for the generation of thin inorganic films on substrates, in particular atomic layer deposition processes. It relates to a process for preparing metal- or semimetal-containing films comprising (a) depositing a metal- or semimetal-containing compound from the gaseous state onto a solid substrate and (b) bringing the solid substrate with the deposited metal- or semimetal-containing compound in contact with compound of general (Continued)

formula (II), (III), or (IV), wherein E is Ge or Sn, R is an alkyl group, an alkenyl group, an aryl group, or a silyl group, R' are an alkyl group, an alkenyl group, an aryl group, or a silyl group, X is nothing, hydrogen, a halide, an alkyl group, an alkylene group, an aryl group, an alkoxy group, an aryl oxy group, an amino group, or a amidinate group, or an guanidinate group, L is an alkyl group, an alkenyl group, an aryl group, or a silyl group.

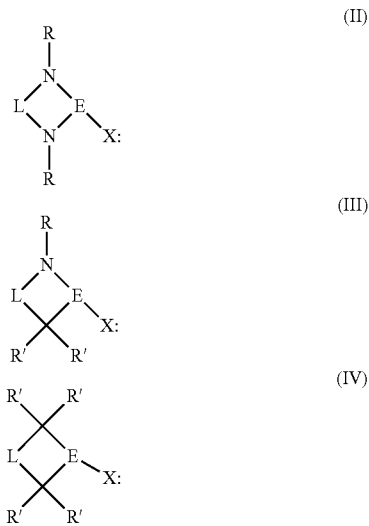

14 Claims, 2 Drawing Sheets

(51) Int. Cl.
    *C23C 16/34*          (2006.01)
    *C23C 16/36*          (2006.01)
    *C23C 16/455*        (2006.01)

(52) U.S. Cl.
    CPC .............. *C23C 16/34* (2013.01); *C23C 16/36* (2013.01); *C23C 16/45534* (2013.01)

(56) References Cited

U.S. PATENT DOCUMENTS

2009/0226612 A1    9/2009    Ogawa et al.
2009/0305458 A1*  12/2009  Hunks ..................... C23C 16/18
                                                     438/102
2014/0154883 A1    6/2014    Humayun et al.
2015/0004316 A1*  1/2015   Thompson .............. C23C 16/08
                                                     427/253
2016/0031919 A1    2/2016    Pore et al.

OTHER PUBLICATIONS

European Search Report for EP Patent Application No. 18183135.5, dated Feb. 11, 2019, 4 pages.
Gwon, et al., "Atomic Layer Deposition of GeTe Films Using Ge{N[Si(CH3)3]2}2, {(CH3)3Si}2Te, and Methanol", Chemistry of Materials, vol. 28, Issue 19, Sep. 9, 2016, pp. 7158-7166.
International Preliminary Reporton Patentability received for PCT Patent Application No. PCT/EP2019/067973, dated Jan. 21, 2021, 8 pages.
International Search Report for PCT Patent Application No. PCT/EP2019/067973, dated Oct. 16, 2019, 4 pages.
Kim, et al., "Synthesis of N-Heterocyclic Stannylene (Sn(II)) and Germylene (Ge(II)) and a Sn(II) Amidinate and Their Application as Precursors for Atomic Layer Deposition", Chemistry of Materials, vol. 26, Issue 10, Mar. 12, 2014, pp. 3065-3073.
Lowes, et al., "A new diamido-amine ligand based on three-carbon atom "arms": synthesis, structures and polymerisation capability of zirconium derivatives of MeN(CH2CH2CH2NSiMe3)2)", Chemical Communications, Issue 1, 2005, pp. 113-115.
Nieder, et al., "Regiodiscriminating Reactivity of Isolable NHC-Coordinated Disilenyl Germylene and Its Cyclic Isomer", Journal of the American Chemical Society, vol. 138, Issue 42, 2016, pp. 13996-14005.
Steven M. George, "Atomic Layer Deposition: An Overview", Chemical Reviews, vol. 110, Issue 1, 2010, pp. 111-131.
Veprek, et al., "Organometallic Chemical Vapor Deposition of Germanium from a Cyclic Germylene, 1,3-Di-tert-butyl-1,3,2-diazagermolidin-2-ylidine", Chemistry of Materials, vol. 8, Issue 4, Apr. 16, 1996, pp. 825-831.
Walewska, et al., "Basic Reactivity Pattern of a Cyclic Disilylated Germylene", Organometallics, vol. 35, Issue 16, 2016, pp. 2728-2737.
Yang, et al., "Direct-liquid-evaporation chemical vapor deposition of smooth, highly conformal cobalt and cobalt nitride thin films", Journal of Materials Chemistry C, vol. 3, Issue 46, 2015, pp. 12098-12106.

* cited by examiner

PROCESS FOR THE GENERATION OF METAL- OR SEMIMETAL-CONTAINING FILMS

CROSS-REFERENCE TO RELATED APPLICATIONS

This application is a national stage application (under 35 U.S.C. § 371) of International Application No. PCT/EP2019/067973, filed Jul. 4, 2019, which claims benefit of European Application No. 18183135.5, filed on Jul. 12, 2018. The entire contents of both applications are incorporated herein by reference in their entireties.

DESCRIPTION

The present invention is in the field of processes for the generation of thin inorganic films on substrates, in particular atomic layer deposition processes.

With the ongoing miniaturization, e.g. in the semiconductor industry, the need for thin inorganic films on substrates increases while the requirements on the quality of such films become stricter. Thin metal or semimetal films serve different purposes such as barrier layers, conducting features, or capping layers. Several methods for the generation of metal or semimetal films are known. One of them is the deposition of film forming compounds from the gaseous state on a substrate. In order to bring metal or semimetal atoms into the gaseous state at moderate temperatures, it is necessary to provide volatile precursors, e.g. by complexation of the metals or semimetals with suitable ligands. In order to convert deposited metal or semimetal complexes to metal or semimetal films, it is usually necessary to expose the deposited metal or semimetal complex to a reducing agent.

Typically, hydrogen gas is used to convert deposited metal complexes to metal films. While hydrogen works reasonably well as reducing agent for relatively noble metals like copper or silver, it does not yield satisfactory results for more electropositive metal or semimetals such as titanium, aluminum, or germanium.

WO 2017/093 265 A1 discloses a process for depositing metal films employing silylenes as reducing agent. While this reducing agent generally yields good results, for some demanding applications, higher vapor pressures, stability and/or reduction potential is required.

WO 2008/057 616 A2 discloses germanium complexes as precursors for CVD/ALD generation of metal thin films. However, these complexes are not used as reducing agents.

US 2008/108 175 A1 disclose a process in which germylene compounds are used to deposit a germanium containing film. However, the compounds disclosed suffer from very low stability and are thus not suitable as reducing agent.

It was therefore an object of the present invention to provide reducing agents, which are capable of reducing surface-bound metal or semimetal atoms to the metallic or semimetallic state leaving less impurity in the metal or semimetal film. The reducing agents should be easy to handle; in particular, it should be possible to vaporize them with as little decomposition as possible. Further, the reducing agent should not decompose at the deposition surface under process conditions but at the same time it should have enough reactivity to participate in a reductive surface reaction. All reaction by-products should be volatile to avoid film contamination. In addition, it should be possible to adjust the process such that metal or semimetal atoms in the reducing agents are either volatile or are incorporated in the film. Furthermore, the reducing agent should be versatile, so it can be applied to a broad range of different metals or semimetals including electropositive metals or semimetals.

These objects were achieved by a process for preparing metal- or semimetal-containing films comprising
(a) depositing a metal- or semimetal-containing compound from the gaseous state onto a solid substrate and
(b) bringing the solid substrate with the deposited metal- or semimetal-containing compound in contact with a compound of general formula (II), (III), or (IV)

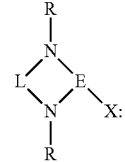

(II)

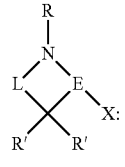

(III)

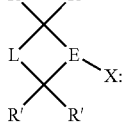

(IV)

wherein E is Ge or Sn,
R is an alkyl group, an alkenyl group, an aryl group, or a silyl group,
R' are an alkyl group, an alkenyl group, an aryl group, or a silyl group,
X is nothing, hydrogen, a halide, an alkyl group, an alkylene group, an aryl group, an alkoxy group, an aryl oxy group, an amino group, or a amidinate group, or an guanidinate group,
L is an alkyl group, an alkenyl group, an aryl group, or a silyl group.

Preferred embodiments of the present invention can be found in the description and the claims. Combinations of different embodiments fall within the scope of the present invention.

The process according to the present invention includes depositing a metal- or semimetal-containing compound from the gaseous state onto a solid substrate. The metal- or semimetal-containing compound contains at least one metal or semimetal atom. Metals include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Semimetals include B, Si, Ge, As, Sb, Se, Te. Preferably, the metal- or semimetal-containing compound contains a metal or semimetal which is more electropositive than Cu, more preferably more electropositive than Ni. In particular, the metal- or semimetal-containing compound contains Ti, Ta, Mn, Mo, W, Ge, Ga, As or Al. It is possible that more than one metal- or semimetal-containing compound is deposited on the surface, either simultaneously or consecutively. If more than one metal- or semimetal-containing compound is deposited on a solid substrate it is possible that all metal- or semimetal-containing compounds contain the same metal or semimetals or different ones, preferably they contain different metals or semimetals.

Any metal- or semimetal-containing compound, which can be brought into the gaseous state, is suitable. These compounds include metal or semimetal alkyls such as dimethyl zinc, trimethylaluminum; metal alkoxylates such as tetramethoxy silicon, tetra-isopropoxy zirconium or tetraisopropoxy titanium; metal or semimetal cyclopentadienyl complexes like pentamethylcyclopendienyl-trimethoxy titanium or di(ethylcycopentadienyl) manganese; metal or semimetal carbenes such as tris(neopentyl)neopentylidene tantalum or bisimidazolidinyliden ruthenium chloride; metal or semimetal halides such as aluminum trichloride, tantalum pentachloride, titanium tetrachloride, molybdenum pentachloride, germanium tetrachloride, gallium trichloride, arsenic trichloride or tungsten hexachloride; carbon monoxide complexes like hexacarbonyl chromium or tetracarbonyl nickel; amine complexes such as bis(tert-butylimino)bis (dimethylamino)molybdenum, bis(tert-butylimino)bis(dimethylamino)tungsten or tetrakis(dimethylamino)titanium; diketonate complexes such as tris(acetylacetonato)aluminum or bis(2,2,6,6-tetramethyl-3,5-heptanedionato) manganese. Metal or semimetal halides are preferred, in particular aluminum chloride, aluminum bromide and aluminum iodide. It is preferred that the molecular weight of the metal- or semimetal-containing compound is up to 1000 g/mol, more preferred up to 800 g/mol, in particular up to 600 g/mol, such as up to 500 g/mol.

The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 μm to 1 mm. In order to avoid particles or fibers to stick to each other while the metal- or semimetal-containing compound is deposited onto them, it is preferably to keep them in motion. This can, for example, be achieved by stirring, by rotating drums, or by fluidized bed techniques.

According to the present invention the solid substrate with the deposited metal- or semimetal-containing compound is brought in contact with a compound of general formula (II), (III), or (IV). These compounds contain a germanium or tin atom in the oxidation state +2. Typically, the compound of general formula (II), (III), or (IV) acts as a reducing agent on the deposited metal- or semimetal-containing compound. The metal- or semimetal-containing compound is usually reduced to a metal or semimetal, a metal or semimetal nitride, a metal or semimetal carbide, a metal or semimetal carbonitride, a metal or semimetal alloy, an intermetallic compound or mixtures thereof. Therefore, the process for preparing metal- or semimetal-containing films is preferably a process for preparing metal or semimetal films, metal or semimetal nitride films, metal or semimetal carbide films, metal or semimetal carbonitride films, metal or semimetal alloy films, intermetallic compound films or films containing mixtures thereof. Metal or semimetal films in the context of the present invention are metal- or semimetal-containing films with high electrical conductivity, usually at least $10^4$ S/m, preferably at least 105 S/m, in particular at least $10^6$ S/m.

The compounds of general formula (II), (III), or (IV) generally have a low tendency to form a permanent bond with the surface of the solid substrate with the deposited metal- or semimetal-containing compound. As a result, the metal- or semimetal-containing film hardly gets contaminated with the reaction by-products of the compound of general formula (II), (III), or (IV). Preferably, the metal- or semimetal-containing film contains in sum less than 5 weight-% nitrogen, more preferably less than 1 wt.-%, in particular less than 0.5 wt.-%, such as less than 0.2 wt.-%.

The compound of general formula (II), (III), or (IV) can contain alkyl groups, alkenyl groups, aryl groups, silyl groups, halides, alkoxy groups, amidinate groups, or guanidinate groups.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, neo-pentyl, 2-ethylhexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, iso-propyl or tert-butyl.

An alkenyl group contains at least one carbon-carbon double bond. The double bond can include the carbon atom with which R is bound to the rest of the molecule, or it can be placed further away from the place where R is bound to the rest of the molecule. Alkenyl groups can be linear or branched. Examples for linear alkenyl groups in which the double bond includes the carbon atom with which R is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where R is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which R is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where R is bound to the rest of the molecule include 2-methyl-1-buten-4-yl, cyclopenten-3-yl, cyclohexene-3-yl. Examples for an alkenyl group with more than one double bonds include 1,3-butadien-1-yl, 1,3-butadien-2-yl, cylopentadien-5-yl.

Aryl groups include aromatic hydrocarbons such as phenyl, naphthalyl, anthrancenyl, phenanthrenyl, cyclopentadienyl, indenyl, fluorenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, alkyl substituted phenyl or cyclopentadienyl is more preferred.

A silyl group is a silicon atom with typically three substituents. Preferably a silyl group has the formula $SiZ_3$, wherein Z is independent of each other hydrogen, an alkyl group, an aryl group or a silyl group. It is possible that all three Z are the same or that two Z are the same and the remaining Z is different or that all three Z are different to each other, preferably all Z are the same. Alkyl and aryl groups are as described above. Examples for silyl groups include SiH$_3$, methylsilyl, trimethylsilyl, triethylsilyl, tri-n-propylsilyl, tri-iso-propylsilyl, tricyclohexylsilyl, dimethyl-tertbutylsilyl, dimethylcyclohexylsilyl, methyl-di-iso-propylsilyl, triphenylsilyl, phenylsilyl, dimethylphenylsilyl, pentamethyldisilyl.

A halide is fluoride, chloride, bromide, iodide, preferably chloride.

An alkoxy group is an oxygen atom substituted with an alkyl chain as described above. An aryloxy group is an oxygen atom substituted with an aryl group as described above.

An amino group preferably is an amine substituted with two alkyl groups, alkenyl groups, aryl groups, or silyl groups as described above. The substituents can be the same or different to each other.

An amidinate group preferably is an amidinate which is substituted on the nitrogen atoms and the carbon atom which is bond to the two nitrogen atoms with alkyl groups, alkenyl groups, aryl groups, or silyl groups as described above. The substituents can be the same or different to each other.

An guanidinate group preferably is an guanidinate which is substituted on the nitrogen atoms with alkyl groups, alkenyl groups, aryl groups, or silyl groups as described above. The substituents can be the same or different to each other.

Preferably, R in the compound of general formula (II), (III), or (IV) bears no hydrogen atom in the 1-position, i.e. R bears no hydrogen atom which is bonded to the atom which is bonded to the nitrogen atom. Examples are alkyl group bearing two alkyl side groups in the 1-position, i.e. 1,1-dialkylalkyl, such as tert-butyl, 1,1-dimethylpropyl; alkyl groups with two halogens in the 1-position such as trifluoromethyl, trichloromethyl, 1,1-difluoroethyl; trialkylsilyl groups such as trimethylsilyl, triethylsilyl, dimethyl-tert-butylsilyl; aryl groups, in particular phenyl or alkyl-substituted phenyl such as 2,6-diisopropylphenyl, 2,4,6-triisopropylphenyl. Alkyl groups bearing no hydrogen atom in the 1-position are particularly preferred.

Preferably the compound of general formula (II) is a compound of general formula (IIa), (IIb), (IIc), (IId), (IIe), (IIf), or (IIg).

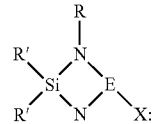
(IIa)

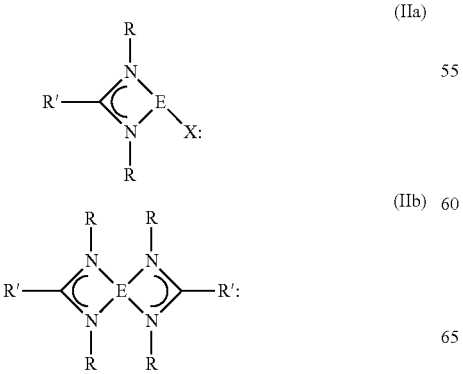
(IIb)

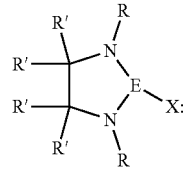
(IIc)

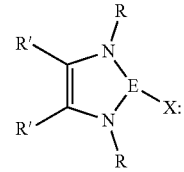
(IId)

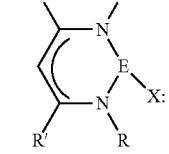
(IIe)

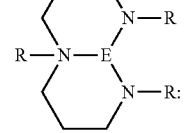
(IIf)

(IIg)

R' is an alkyl group, an alkenyl group, an aryl group, or a silyl group with the definitions as above. R' can be the same as R or different to R. In the compound of general formula (IIb), (IIc), (IId), (IIe), (IIf), the R' can be the same or different to each other.

Some preferred examples of the compound of general formula (II) are given in the table below.

| No. | Formula | E | X | R | R' |
|---|---|---|---|---|---|
| IIa-1 | (IIa) | Ge | — | iPr | Me |
| IIa-2 | (IIa) | Ge | Cl | iPr | tBu |
| IIa-3 | (IIa) | Ge | Cl | Dip | tBu |
| IIa-4 | (IIa) | Ge | Cl | Ph | tBu |
| IIa-5 | (IIa) | Sn | Cl | Dip | tBu |
| IIa-6 | (IIa) | Sn | OiPr | Dip | tBu |
| IIa-7 | (IIa) | Sn | N(Me)$_2$ | Dip | tBu |
| IIa-8 | (IIa) | Sn | N(TMS)$_2$ | Dip | tBu |
| IIa-9 | (IIa) | Sn | N(TMS)$_2$ | Cy | Me |
| IIa-10 | (IIa) | Sn | N(TMS)$_2$ | Cy | tBu |
| IIa-11 | (IIa) | Ge | N(TMS)$_2$ | Cy | Me |
| IIa-12 | (IIa) | Ge | N(TMS)$_2$ | Cy | tBu |
| IIa-13 | (IIa) | Sn | N(TMS)$_2$ | TMS | tBu |
| IIa-14 | (IIa) | Sn | N(TMS)$_2$ | TMS | Ph |
| IIa-15 | (IIa) | Sn | N(TMS)$_2$ | Si(Me)$_2$Ph | Ph |
| IIa-16 | (IIa) | Sn | OC(Ph)$_3$ | TMS | Ph |
| IIa-17 | (IIa) | Sn | OC(Ph)$_3$ | Si(Me)$_2$Ph | Ph |
| IIb-1 | (IIb) | Ge | — | Dip | H |
| IIb-2 | (IIb) | Ge | — | iPr | TMS |
| IIb-3 | (IIb) | Ge | — | iPr | tBu |
| IIb-4 | (IIb) | Ge | — | iPr | nBu |
| IIb-5 | (IIb) | Sn | — | Dip | Me |

-continued

| No. | Formula | E | X | R | R' |
|---|---|---|---|---|---|
| IIb-6 | (IIb) | Sn | — | TMS | Ph |
| IIb-7 | (IIb) | Sn | — | Cy | Me |
| IIb-8 | (IIb) | Sn | — | Cy | tBu |
| IIb-9 | (IIb) | Sn | — | TMS | Me |
| IIb-10 | (IIb) | Sn | — | Si(Me)$_2$Ph | Me |
| IIc-1 | (IIc) | Sn | — | tBu | Me |
| IIc-2 | (IIc) | Sn | — | TMS | Me |
| IIc-3 | (IIc) | Ge | — | tBu | Me |
| IIc-4 | (IIc) | Ge | — | TMS | Me |
| IId-1 | (IId) | Sn | — | Me | H |
| IId-2 | (IId) | Sn | — | iPr | H |
| IId-3 | (IId) | Sn | — | tBu | H |
| IId-4 | (IId) | Sn | — | Ph | H |
| IId-5 | (IId) | Sn | — | Dip | H |
| IId-6 | (IId) | Sn | — | Mes | H |
| IId-7 | (IId) | Sn | — | Me | Me |
| IId-8 | (IId) | Ge | — | Me | H |
| IId-9 | (IId) | Ge | — | iPr | H |
| IId-10 | (IId) | Ge | — | tBu | H |
| IId-11 | (IId) | Ge | — | Ph | H |
| IId-12 | (IId) | Ge | — | Dip | H |
| IId-13 | (IId) | Ge | — | Mes | H |
| IId-14 | (IId) | Ge | — | Me | Me |
| IIe-1 | (IIe) | Sn | — | Me | H |
| IIe-2 | (IIe) | Sn | — | iPr | H |
| IIe-3 | (IIe) | Sn | — | tBu | H |
| IIe-4 | (IIe) | Sn | — | Ph | H |
| IIe-5 | (IIe) | Sn | — | Dip | H |
| IIe-6 | (IIe) | Sn | — | Mes | H |
| IIe-7 | (IIe) | Sn | — | Me | Me |
| IIe-8 | (IIe) | Ge | — | Me | H |
| IIe-9 | (IIe) | Ge | — | iPr | H |
| IIe-10 | (IIe) | Ge | — | tBu | H |
| IIe-11 | (IIe) | Ge | — | Ph | H |
| IIe-12 | (IIe) | Ge | — | Dip | H |
| IIe-13 | (IIe) | Ge | — | Mes | H |
| IIe-14 | (IIe) | Ge | — | Me | Me |
| IIf-1 | (IIf) | Ge | Cl | Dip | Me |
| IIf-2 | (IIf) | Ge | Cl | Mes | Me |
| IIf-3 | (IIf) | Ge | Cl | iPr | Me |
| IIf-4 | (IIf) | Ge | Cl | Ph | Me |
| IIf-5 | (IIf) | Ge | Cl | C$_6$F$_5$ | Me |
| IIf-6 | (IIf) | Ge | I | Ph | Me |
| IIg-1 | (IIg) | Ge | — | Me | — |
| IIg-2 | (IIg) | Ge | — | tBu tBu Me | — |
| IIg-3 | (IIg) | Ge | — | TMS TMS Me | — |
| IIg-4 | (IIg) | Sn | — | Me | — |
| IIg-5 | (IIg) | Sn | — | tBu tBu Me | — |
| IIg-6 | (IIg) | Sn | — | TMS TMS Me | — |

TMS stands for trimethylsilyl,
Me for methyl,
iPr for isopropyl,
tBu for tertbutyl,
Cy for cyclohexyl,
Ph for phenyl,
Mes for mesityl,
Dip for Diisopropylphenyl,
cp* for pentamethylcyclopentadienyl.

A summary of the synthesis and the properties of some compounds of general formula (II) can be found in an article by C. Jones et al. in Chemical Reviews, volume 111 (2011), page 354.

Preferably, the compound of general formula (III) is a compound of general formula (IIIa) or (IIIb).

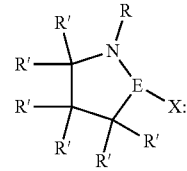

(IIIa)

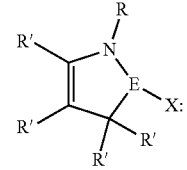

(IIIb)

Some preferred examples of the compound of general formula (III) are given in the table below.

| No. | Formula | E | X | R | R' |
|---|---|---|---|---|---|
| IIIa-1 | (IIIa) | Ge | — | Ph | H |
| IIIb-1 | (IIIb) | Ge | — | Ph | H TMS |

Preferably, the compound of general formula (IV) is a compound of general formula (IVa) or (IVb).

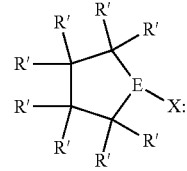

(IVa)

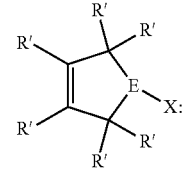

(IVb)

As alternative to a compound of general formula (II), (III), or (IV) a compound of general formula (Va) or (Vb) can be used

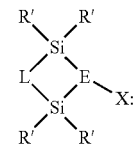

(Va)

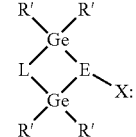

(Vb)

wherein E is Ge or Sn,

R' are an alkyl group, an alkenyl group, an aryl group, or a silyl group,

X is nothing, hydrogen, a halide, an alkyl group, an alkylene group, an aryl group, an alkoxy group, an aryl oxy group, an amino group, or a amidinate group, or an guanidinate group, L is nothing, an alkyl group, an alkenyl group, an aryl group, or a silyl group. The same definitions and preferred embodiments as described above apply.

Some preferred examples of the compound of general formula (Va) and (Vb) are given in the table below.

| No. | Formula | E | X | R' | L |
|---|---|---|---|---|---|
| Va-1 | (Va) | Ge | — | TMS | —Si(Me$_2$)—Si(Me$_2$)— |
| Va-2 | (Va) | Sn | — | TMS | —Si(Me$_2$)—Si(Me$_2$)— |
| Va-3 | (Va) | Ge | PMe$_3$ | TMS | —Si(Me$_2$)—Si(Me$_2$)— |
| Va-4 | (Va) | Sn | PMe$_3$ | TMS | —Si(Me$_2$)—Si(Me$_2$)— |
| Va-5 | (Va) | Ge | NHC | TIP | — |
| Va-5 | (Va) | Sn | NHC | TIP | — |
| Vb-1 | (Vb) | Ge | — | TMS | —Si(Me$_2$)—Si(Me$_2$)— |
| Vb-2 | (Vb) | Sn | — | TMS | —Si(Me$_2$)—Si(Me$_2$)— |
| Vb-3 | (Vb) | Ge | PMe$_3$ | TMS | —Si(Me$_2$)—Si(Me$_2$)— |
| Vb-4 | (Vb) | Sn | PMe$_3$ | TMS | —Si(Me$_2$)—Si(Me$_2$)— |
| Vb-5 | (Vb) | Ge | NHC | TIP | — |
| Vb-5 | (Vb) | Sn | NHC | TIP | — |

NHC stands for N,N-diisopropylimidazol-2-yl,
TIP for 2,4,6-triisopropylphenyl.

The synthesis of compounds of general formula (Va) and (Vb) is for example described by M. Walewska et al. in Organometallics, volume 35 (2016), page 2728-2737 or by D. Nieder et al. in the Journal of the American Chemical Society, volume 138 (2016), page 13996-14005.

Some preferred examples of the compound of general formula (IV) are given in the table below.

| No. | Formula | E | X | R' |
|---|---|---|---|---|
| IVa-1 | (IVa) | Ge | — | H |
| IVa-2 | (IVa) | Sn | — | H |
| IVb-1 | (IVb) | Ge | — | H<br>TMS |

The compound of general formula (II), (III), or (IV) preferably has a molecular weight of not more than 1000 g/mol, more preferably not more than 800 g/mol, even more preferably not more than 600 g/mol, in particular not more than 500 g/mol. The compound of general formula (II), (III), or (IV) preferably has a decomposition temperature of at least 80° C., more preferably at least 100° C., in particular at least 120° C., such as at least 150° C. Often, the decomposition temperature is not more than 250° C. The compound of general formula (II), (III), or (IV) has a high vapor pressure. Preferably, the vapor pressure is at least 1 mbar at a temperature of 200° C., more preferably at 150° C., in particular at 120° C. Usually, the temperature at which the vapor pressure is 1 mbar is at least 50° C.

Both the metal- or semimetal-containing compound and the compound of general formula (II), (III), or (IV) used in the process according to the present invention are used at high purity to achieve the best results. High purity means that the substance used contains at least 90 wt.-% metal- or semimetal-containing compound or compound of general formula (II), (III), or (IV), preferably at least 95 wt.-%, more preferably at least 98 wt.-%, in particular at least 99 wt.-%. The purity can be determined by elemental analysis according to DIN 51721 (Prüfung fester Brennstoffe—Bestimmung des Gehaltes an Kohlenstoff und Wasserstoff—Verfahren nach Radmacher-Hoverath, August 2001).

The metal- or semimetal-containing compound or the compound of general formula (II), (III), or (IV) can be deposited or brought in contact with the solid substrate from the gaseous state. They can be brought into the gaseous state for example by heating them to elevated temperatures. In any case a temperature below the decomposition temperature of the metal- or semimetal-containing compound or the compound of general formula (II), (III), or (IV) has to be chosen. In this context, the oxidation of the compound of general formula (II), (III), or (IV) is not regarded as decomposition. A decomposition is a reaction in which the metal- or semimetal-containing compound or the compound of general formula (II), (III), or (IV) is converted to an undefined variety of different compounds. Preferably, the heating temperature ranges from 0° C. to 300° C., more preferably from 10° C. to 250° C., even more preferably from 20° C. to 200° C., in particular from 30° C. to 150° C.

Another way of bringing the metal- or semimetal-containing compound or the compound of general formula (II), (III), or (IV) into the gaseous state is direct liquid injection (DLI) as described for example in US 2009/0 226 612 A1. In this method the metal- or semimetal-containing compound or the compound of general formula (II), (III), or (IV) is typically dissolved in a solvent and sprayed in a carrier gas or vacuum. If the vapor pressure of metal- or semimetal-containing compound or the compound of general formula (II), (III), or (IV) and the temperature are sufficiently high and the pressure is sufficiently low the metal- or semimetal-containing compound or the compound of general formula (II), (III), or (IV) is brought into the gaseous state. Various solvents can be used provided that the metal- or semimetal-containing compound or the compound of general formula (II), (III), or (IV) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable.

Alternatively, the metal- or semimetal-containing compound or the compound of general formula (II), (III), or (IV) can be brought into the gaseous state by direct liquid evaporation (DLE) as described for example by J. Yang et al. (Journal of Materials Chemistry, 2015). In this method, the metal- or semimetal-containing compound or the compound of general formula (II), (III), or (IV) is mixed with a solvent, for example a hydrocarbon such as tetradecane, and heated below the boiling point of the solvent. By evaporation of the solvent, the metal- or semimetal-containing compound or the compound of general formula (II), (III), or (IV) is brought into the gaseous state. This method has the advantage that no particulate contaminants are formed on the surface.

It is preferred to bring the metal- or semimetal-containing compound or the compound of general formula (II), (III), or (IV) into the gaseous state at decreased pressure. In this way, the process can usually be performed at lower heating temperatures leading to decreased decomposition of the metal- or semimetal-containing compound or the compound of general formula (II), (III), or (IV). It is also possible to use increased pressure to push the metal- or semimetal-containing compound or the compound of general formula (II), (III), or (IV) in the gaseous state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

It is also possible that the metal- or semimetal-containing compound or the compound of general formula (II), (III), or (IV) is deposited or brought in contact with the solid substrate from solution. Deposition from solution is advantageous for compounds which are not stable enough for evaporation. However, the solution needs to have a high purity to avoid undesirable contaminations on the surface. Deposition from solution usually requires a solvent which does not react with the metal- or semimetal-containing compound or the compound of compound of general formula (II), (III), or (IV). Examples for solvents are ethers like diethyl ether, methyl-tert-butylether, tetrahydrofuran, dioxane; aromatic hydrocarbons like benzene, toluene, xylene, mesitylene, ethylbenzene, styrene; aliphatic hydrocarbons like n-pentane, n-hexane, cyclohexane, isoundecane, decaline, hexadecane. Ethers are preferred, in particular tetrahydrofuran. The concentration of the metal- or semimetal-containing compound or the compound of general formula (II), (III), or (IV) depend among others on the reactivity and the desired reaction time. Typically, the concentration is 0.1 mmol/l to 10 mol/l, preferably 1 mmol/l to 1 mol/l, in particular 10 to 100 mmol/l.

For the deposition process, it is possible to sequentially contact the solid substrate with a metal- or semimetal-containing compound and with a solution containing a compound of general formula (II), (III), or (IV). Bringing the solid substrate in contact to the solutions can be performed in various ways, for example by dip-coating or spin-coating. Often it is useful to remove excess metal- or semimetal-containing compound or the compound of general formula (II), (III), or (IV), for example by rinsing with the pristine solvent. The reaction temperature for solution deposition is typically lower than for deposition from the gaseous or aerosol phase, typically 20 to 150° C., preferably 50 to 120° C., in particular 60 to 100° C. In some cases it can be useful to anneal the film after several deposition steps, for example by heating to temperatures of 150 to 500° C., preferably 200 to 450° C., for 10 to 30 minutes.

The deposition of the metal- or semimetal-containing compound takes place if the substrate comes in contact with the metal- or semimetal-containing compound. Generally, the deposition process can be conducted in two different ways: either the substrate is heated above or below the decomposition temperature of the metal- or semimetal-containing compound. If the substrate is heated above the decomposition temperature of the metal- or semimetal-containing compound, the metal- or semimetal-containing compound continuously decomposes on the surface of the solid substrate as long as more metal- or semimetal-containing compound in the gaseous state reaches the surface of the solid substrate. This process is typically called chemical vapor deposition (CVD). Usually, an inorganic layer of homogeneous composition, e.g. the metal or semimetal oxide or nitride, is formed on the solid substrate as the organic material is desorbed from the metal or semimetal M. This inorganic layer is then converted to the metal or semimetal layer by bringing it in contact with the compound of general formula (II), (III), or (IV). Typically, the solid substrate is heated to a temperature in the range of 300 to 1000° C., preferably in the range of 350 to 600° C.

Alternatively, the substrate is below the decomposition temperature of the metal- or semimetal-containing compound. Typically, the solid substrate is at a temperature equal to or slightly above the temperature of the place where the metal- or semimetal-containing compound is brought into the gaseous state, often at room temperature or only slightly above. Preferably, the temperature of the substrate is 5° C. to 40° C. higher than the place where the metal- or semimetal-containing compound is brought into the gaseous state, for example 20° C. Preferably, the temperature of the substrate is from room temperature to 400° C., more preferably from 100 to 300° C., such as 150 to 220° C.

The deposition of metal- or semimetal-containing compound onto the solid substrate is either a physisorption or a chemisorption process. Preferably, the metal- or semimetal-containing compound is chemisorbed on the solid substrate. One can determine if the metal- or semimetal-containing compound chemisorbs to the solid substrate by exposing a quartz microbalance with a quartz crystal having the surface of the substrate in question to the metal- or semimetal-containing compound in the gaseous state. The mass increase is recorded by the eigen frequency of the quartz crystal. Upon evacuation of the chamber in which the quartz crystal is placed the mass should not decrease to the initial mass, but up to one, two or three monolayers of the residual metal- or semimetal-containing compound remains if chemisorption has taken place. In most cases where chemisorption of the metal- or semimetal-containing compound to the solid substrate occurs, the x-ray photoelectron spectroscopy (XPS) signal (ISO 13424 EN—Surface chemical analysis—X-ray photoelectron spectroscopy—Reporting of results of thin-film analysis; October 2013) of M changes due to the bond formation to the substrate.

If the temperature of the substrate in the process according to the present invention is kept below the decomposition temperature of the metal- or semimetal-containing compound, typically a monolayer is deposited on the solid substrate. Once a molecule of the metal- or semimetal-containing compound is deposited on the solid substrate further deposition on top of it usually becomes less likely. Thus, the deposition of the metal- or semimetal-containing compound on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen und dielektrischen Materialeigenschaften sowie der Schichtdicke dOnner Schichten mittels Ellipsometrie; February 2004).

A deposition process comprising a self-limiting process step and a subsequent self-limiting reaction is often referred to as atomic layer deposition (ALD). Equivalent expressions are molecular layer deposition (MLD) or atomic layer epitaxy (ALE). Hence, the process according to the present invention is preferably an ALD process. The ALD process is described in detail by George (Chemical Reviews 110 (2010), 111-131).

A particular advantage of the process according to the present invention is that the compound of general formula (II), (III), or (IV) is very versatile, so the process parameters can be varied in a broad range. Therefore, the process according to the present invention includes both a CVD process as well as an ALD process.

Preferably, after deposition of a metal- or semimetal-containing compound on the solid substrate and before bringing the solid substrate with the deposited metal- or semimetal-containing compound in contact with a reducing agent, the solid substrate with the deposited metal- or semimetal-containing compound is brought in contact with an acid in the gaseous phase. Without being bound by a theory, it is believed that the protonation of the ligands of the metal- or semimetal-containing compound facilitates its decomposition and reduction. Suitable acids include hydrochloric acid and carboxylic acids, preferably, carboxylic acids such as formic acid, acetic acid, propionic acid, butyric acid, or trifluoroacetic acid, in particular formic acid.

Often it is desired to build up thicker layers than those just described. In order to achieve this the process comprising (a) and (b), which can be regarded as one ALD cycle, are preferably performed at least twice, more preferably at least 10 times, in particular at least 50 times. Usually, the process comprising (a) and (b) is performed not more than 1000 times.

The deposition of the metal- or semimetal-containing compound or its contacting with a reducing agent can take from milliseconds to several minutes, preferably from 0.1 second to 1 minute, in particular from 1 to 10 seconds. The longer the solid substrate at a temperature below the decomposition temperature of the metal- or semimetal-containing compound is exposed to the metal- or semimetal-containing compound the more regular films formed with less defects. The same applies for contacting the deposited metal- or semimetal-containing compound to the reducing agent.

The process according to the present invention yields a metal or semimetal film. A film can be only one monolayer of a metal or semimetal or be thicker such as 0.1 nm to 1 μm, preferably 0.5 to 50 nm. A film can contain defects like holes. These defects, however, generally constitute less than half of the surface area covered by the film. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are XPS or ellipsometry.

The film obtained by the process according to the present invention can be used in an electronic element. Electronic elements can have structural features of various sizes, for example from 100 nm to 100 μm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film obtained by the process according to the present invention serves to increase the refractive index of the layer which reflects light.

Preferred electronic elements are transistors. Preferably the film acts as chemical barrier metal or semimetal in a transistor. A chemical barrier metal or semimetal is a material which reduces diffusion of adjacent layers while maintaining electrical connectivity.

EXAMPLES

Figure 1:
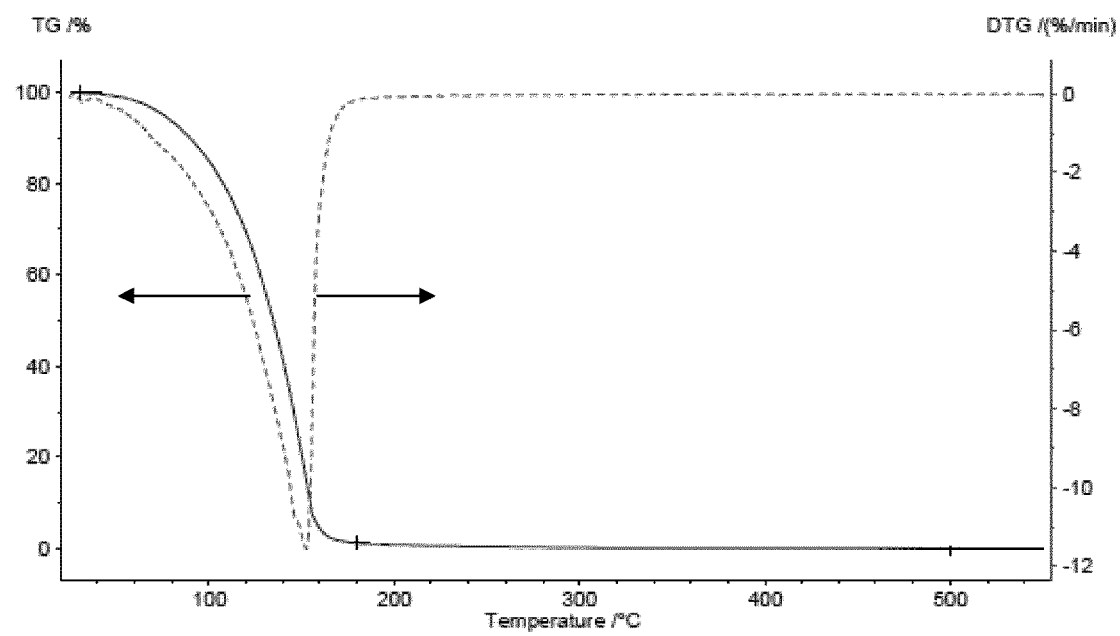
FIG. 1 shows the thermogravimetry (TG) and the differential thermogravimetry (DTG) curves of compound IIc-1.
Figure 2:
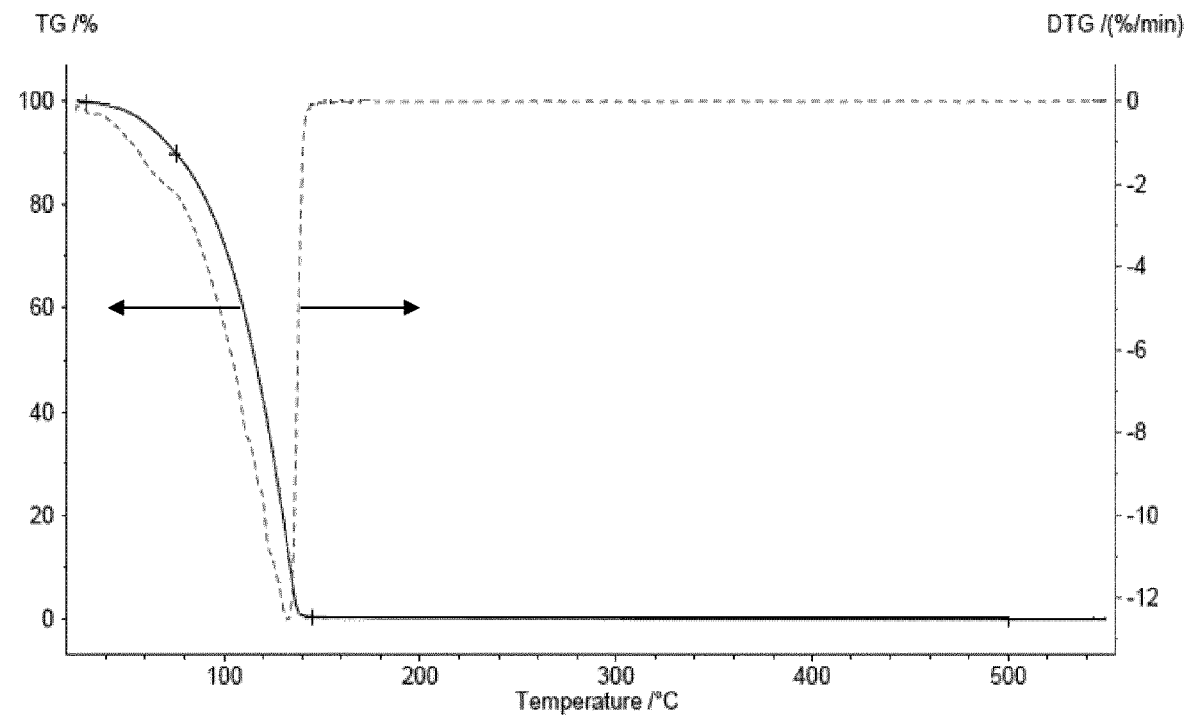
FIG. 2 shows the thermogravimetry (TG) and the differential thermogravimetry (DTG) curves of compound IIc-3.
Figure 3:
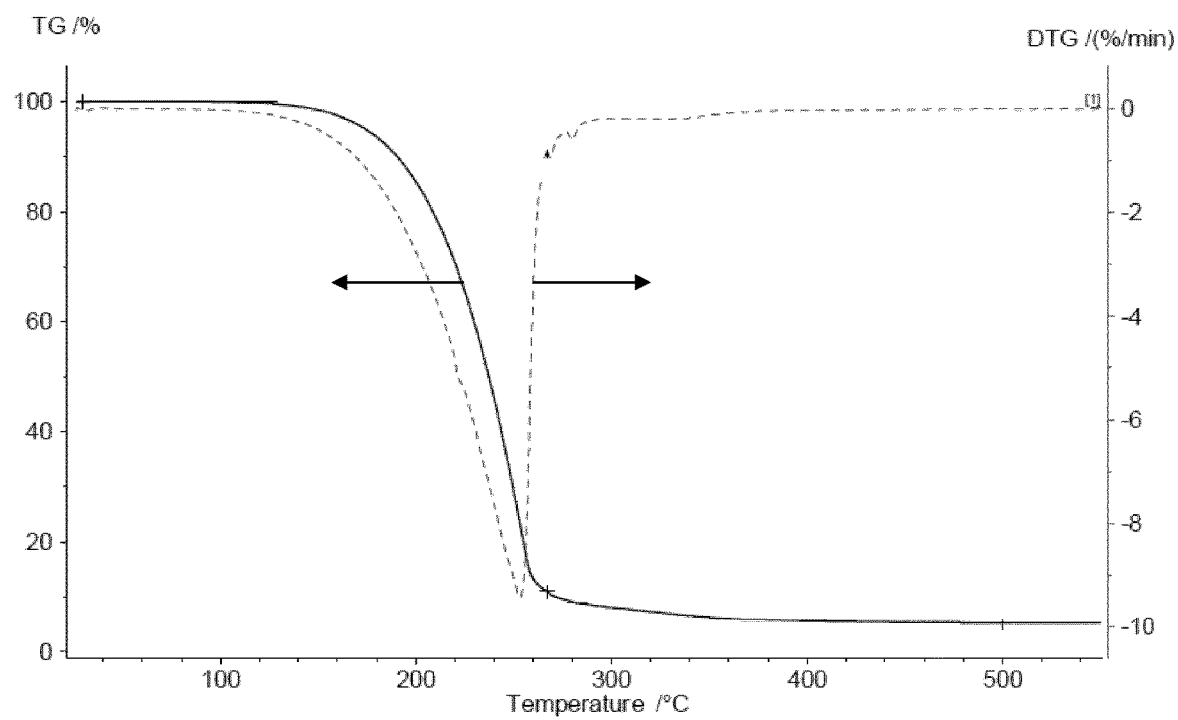
FIG. 3 shows the thermogravimetry (TG) and the differential thermogravimetry (DTG) curves of compound IIg-3.

All manipulations were carried out under a protective atmosphere of argon (purity >99.999%), using Schlenk techniques or in a glovebox. Dioxane was refluxed over Na/benzophenone and distilled before use. Deuterated solvent ($C_6D_6$) was dried over potassium then distilled under argon. NMR spectra were recorded on a Bruker Avance III 300 MHz spectrometer. High resolution mass spectrum (MS-Cl) was recorded on Finnigan 950S mass spectrometer (methane, 4.7 kV). Germanium dichloride adduct with dioxane was purchased from ABCR and was used without further purification. Starting materials diamine MeN($CH_2CH_2CH_2N(H)SiMe_2$)$_2$ and its di-lithium salt were prepared according to literature procedure: Thomas A. Lowes, Benjamin D. Ward, Robert A. Whannel, Stuart R. Dubberley, Philip Mountford, Chemical Communications, 2005, 113-115.

Synthesis of IIg-3

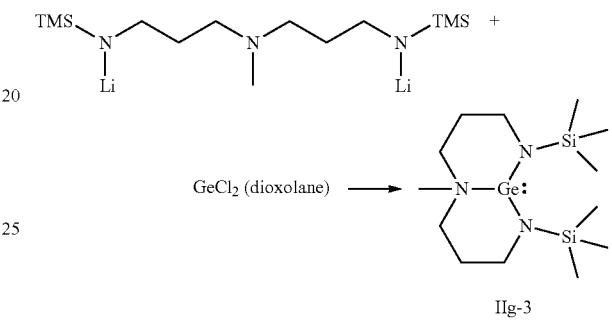

A solution of germanium dichloride adduct with dioxane $GeCl_2$*dioxane (1.27 g, 5.48 mmol) in dioxane (~30 mL) was added dropwise to a precooled solution (15° C.) of lithium 2,2,7,12,12-pentamethyl-3,7,11-triaza-2,12-disilatridecane-3,11-diide (1.66 g, 5.50 mmol) in dioxane ~40 mL. The reaction mixture was stirred overnight at room temperature to give a yellowish solution. All volatiles were removed in vacuo. The remaining residue was extracted with hexane (~70 mL) and filtered. Solvent was removed in vacuo. A remaining oil was kept in vacuo ($4*10^{-2}$ mbar/bath temp. from 60-95° C. for 20 minutes) to afford as a residue compound IIg-3 (1.77 g, 4.91 mmol) as a yellowish oil.

$^1$H NMR (300.13 MHz, 300 K, $CD_6$): δ=3.38 (m, 2H, $CH_2$) 3.08 (m, 2H, $CH_2$), 2.72 (br, 2H, $CH_2$), 1.87 (s, 3H, $NCH_3$), 1.86 (br, 2H, $CH_2$), 1.25 (m, 4H, $CH_2$), 0.31 (s, 18H, Si($CH_3$)$_3$). $^{13}$C{$^1$H} NMR (75.47 MHz, 300 K, $CD_6$): δ=57.50, 43.59, 43.54 ($NCH_2$, $NCH_3$), 27.80 ($NCH_2CH_2$), 1.46 (Si($CH_3$)$_3$).

HR MS (Cl, m/z): [M+H]$^+$ found 362.1500, calculated for $C_{13}H_{34}N_3GeSi_2$ 362.1503.

The invention claimed is:

1. Process for preparing metal- or semimetal-containing films comprising
    (a) depositing a metal- or semimetal-containing compound from the gaseous state onto a solid substrate and
    (b) bringing the solid substrate with the deposited metal- or semimetal-containing compound in contact with a compound of general formula (II), (III), or (IV)

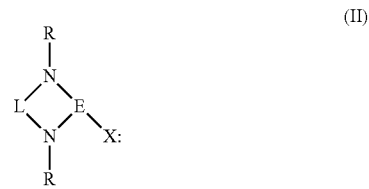

-continued

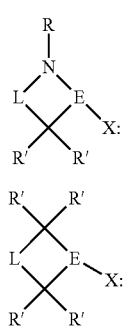

(III)

(IV)

wherein E is Ge or Sn,

R is an alkyl group, an alkenyl group, an aryl group, or a silyl group,

R' are an alkyl group, an alkenyl group, an aryl group, or a silyl group,

X is nothing, hydrogen, a halide, an alkyl group, an alkylene group, an aryl group, an alkoxy group, an aryl oxy group, an amino group, or an amidinate group, or a guanidinate group, L is an alkyl group, an alkenyl group, an aryl group, or a silyl group, wherein compound of the compound of general formula (II) is a compound of general formula (IIa), (IIc), (IIf) or (IIg)

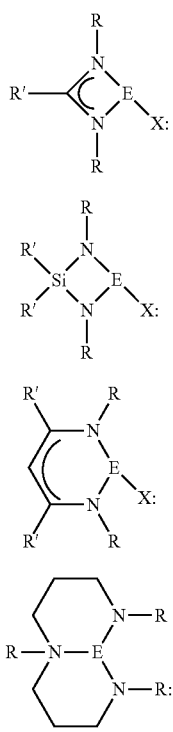

(IIa)

(IIc)

(IIf)

(IIg)

wherein R' is an alkyl group, an alkenyl group, an aryl group, or a silyl group.

2. The process according to claim 1, wherein the compound of general formula (II), (III), or (IV) is a compound of general formula (IIa), (IIc), (IIf) or (IIg).

3. The process according to claim 1, wherein the compound of general formula (III) is a compound of general formula (IIIa) or (IIIb)

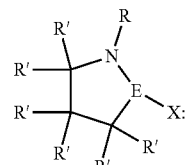

(IIIa)

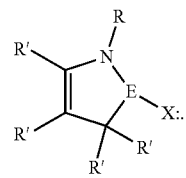

(IIIb)

4. The process according to claim 1, wherein the compound of general formula (IV) a compound of general formula (IVa) or (IVb)

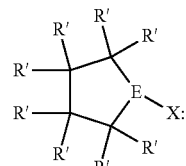

(IVa)

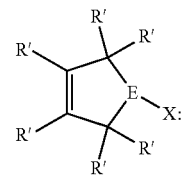

(IVb)

5. The process according to claim 1, wherein R bears no hydrogen atom in the 1-position.

6. The process according to claim 1, wherein the compound of general formula (II), (III), or (IV) has a molecular weight of not more than 600 g/mol.

7. The process according to claim 1, wherein the compound of general formula (II), (III), or (IV) has a vapor pressure at least 1 mbar at a temperature of 200° C.

8. The process according to claim 1, wherein (a) and (b) are successively performed at least twice.

9. The process according to claim 1, wherein the metal- or semimetal-containing compound contains Ti, Ta, Mn, Mo, W, Ge, Ga, As or Al.

10. The process according to claim 1, wherein the metal- or semimetal-containing compound is a metal or semimetal halide.

11. The process according to claim 1, wherein the metal- or semimetal-containing compound and the compound of general formula (II), (III), or (IV) are brought into the gaseous state by heating them to a temperature of 20° C. to 200° C.

12. The process according to claim 1, wherein the metal- or semimetal-containing film is a metal or semimetal film, a metal or semimetal nitride film, a metal or semimetal carbide film, a metal or semimetal carbonitride film, a metal or semimetal alloy films, or an intermetallic compound film.

13. The process according to claim 1, wherein the metal- or semimetal-containing film has an electrical conductivity of at least $10^4$ S/m.

14. The process according to claim 1, wherein metal- or semimetal-containing film contains in sum less than 5 weight-% nitrogen.

* * * * *